(12) United States Patent
Nagarkar

(10) Patent No.: US 8,829,445 B1
(45) Date of Patent: Sep. 9, 2014

(54) HOT WALL SCINTILLATOR FABRICATION OF STRONTIUM HALIDE, CALCIUM HALIDE, CERIUM HALIDE, AND CESIUM BARIUM HALIDE SCINTILLATORS

(75) Inventor: Vivek Nagarkar, Weston, MA (US)

(73) Assignee: Radiation Monitoring Devices, Inc., Watertown, MA (US)

( * ) Notice: Subject to any disclaimer, the term of this patent is extended or adjusted under 35 U.S.C. 154(b) by 0 days.

(21) Appl. No.: 13/460,705

(22) Filed: Apr. 30, 2012

Related U.S. Application Data

(60) Provisional application No. 61/480,325, filed on Apr. 28, 2011.

(51) Int. Cl.
G01T 1/20 (2006.01)

(52) U.S. Cl.
CPC ........................................ *G01T 1/20* (2013.01)
USPC .......................................... 250/362; 250/369

(58) Field of Classification Search
CPC ........................................................ G01T 1/20
USPC ............................................ 250/362, 361 R
See application file for complete search history.

(56) References Cited

U.S. PATENT DOCUMENTS

| | | | |
|---|---|---|---|
| 4,668,480 A | 5/1987 | Fujiyashu et al. | |
| 7,504,634 B2 | 3/2009 | Shah | |
| 7,612,342 B1 | 11/2009 | Nagarkar | |
| 2005/0082484 A1* | 4/2005 | Srivastava et al. | 250/361 R |
| 2005/0285041 A1* | 12/2005 | Srivastava et al. | 250/361 R |
| 2006/0197023 A1* | 9/2006 | Srivastava et al. | 250/362 |
| 2007/0051896 A1 | 3/2007 | Okada et al. | |
| 2007/0205371 A1 | 9/2007 | Inoue | |
| 2008/0083877 A1 | 4/2008 | Nomura et al. | |
| 2008/0286461 A1 | 11/2008 | Noguchi et al. | |
| 2009/0008561 A1 | 1/2009 | Nagarkar et al. | |
| 2009/0050811 A1 | 2/2009 | Barrett et al. | |
| 2010/0034351 A1* | 2/2010 | Yanagita et al. | 378/62 |
| 2010/0230601 A1* | 9/2010 | Martins Loureiro et al. | 250/361 R |

OTHER PUBLICATIONS

U.S. Appl. No. 12/721,505, filed Mar. 10, 2010, Nagarkar et al.
U.S. Appl. No. 13/460,626, filed Apr. 30, 2012, Nagarkar et al.
Babla et al., "A triple-head solid state camera for cardiac single photon emission tomography," Proc. of SPIE 6319:63190M 1-5 (2006).
Bartzakos & Thompson, "A PET detector with depth-of-interaction determination," Phys. Med. Biol. 3 6(6): 735-748 (1991).
Burr et al., "Evaluation of a prototype small-animal PET detector with depth-of-interaction encoding," IEEE Trans. NucL Sci. 51(4):1791-1798 (2004).
Derenzo et al., "Initial characterization of a position-sensitive photodiode/BGO detector for PET," IEEE Trans. NucL Sci. 36(1):1-6 (1989).
Gramsch, "Measurement of the depth of interaction of an LSO scintillator using a planar process ADP," IEEE Trans. on NucL Sci. 50 (3):307-312 (2003).
Huber et al., "An LSO scintillator array for a PET detector module with depth of interaction measurement," IEEE Trans. Nucl. Sci. 48:684-688 (2001).

(Continued)

*Primary Examiner* — David Porta
*Assistant Examiner* — Faye Boosalis
(74) *Attorney, Agent, or Firm* — Wilson Sonsini Goodrich & Rosati

(57) ABSTRACT

Strontium halide scintillators, calcium halide scintillators, cerium halide scintillators, cesium barium halide scintillators, and related devices and methods are provided.

20 Claims, 7 Drawing Sheets

(56) References Cited

OTHER PUBLICATIONS

Inadama et al., "A Depth of Interaction Detector for PET with GSO Crystals doped with Different amount of Ce," IEEE, 1099-1103 (2002).

Karp & Daube-Witherspoon, "Depth-of-interaction determination in NaI(T1) and BGO scintillation crystals using a temperature gradient," Nucl. Instr. Methods Phys. Res. A260:509-517 (1987).

Knoll, "Pulse Shape Discrimination," in: Radiation Detection and Measurement, Third Edition, Glenn F. Knoll, John Wiley & Sons, NY, p. 646 (2000).

Knoll, "Specialized Detector Configurations Based on Scintillation," in: Radiation Detection and Measurement, Second Edition, John Wiley & Sons, NY, p. 344-345 (1989).

Kupinski and Barrett, Small-Animal SPECT Imaging, Springer Science+Business Media Inc. (2005).

Ling et al., "Depth of interaction decoding of a continuous crystal detector module," Phys. Med. Biol. 52:2213-2228 (2007).

MacDonald & Dahlbom, "Depth of interaction for PET using segmented crystals," IEEE Trans. Nucl. Sci. 45(4):2144-2148 (1998).

Miyaoka et al., "Design of a depth of interaction (DOI) PET Detector Module," IEEE Trans. on Nucl. Sci. 45(3):1069-1073 (1998).

Moisan et al., "Segmented LSO crystals for depth-of-interaction encoding in PET," IEEE Trans. Nucl. Sci. 45(6):3030-3035 (1998).

Murayama et al., "Design of a depth of interaction detector with a PS-PMT for PET," IEEE Trans. Nucl. Sci. 47(3):1045-1050 (2000).

Nagarakar at al., "Development of microcolumnar Labr3:Ce scintillator," Proc. of SPIE 7450:745006-1-745006-10 (2009).

Nagarakar et al., "Microcolumnar and polycrystalline growth of LaBr3:Ce scintillator," Nucl. Instr. and Meth. A (2010), doi:10.1016/j.nima.2010.06.190.

Saoudi at al., "Investigation of depth-of-interaction by pulse shape discrimination in multicrystal detectors read out by avalanche photodiodes," IEEE Trans. Nucl. Sci. 46(3):462-467 (1999).

Schramm et al., High-resolution SPECT using multi-pinhole collimation, IEEE Trans. Nucl. Sci. 50(3):774-777 (2003).

Seidel et al., "Depth identification accuracy of a three layer phoswich PET detector module," IEEE Trans. Nucl. Sci. 46(3):485-490 (1999).

Shah at al., "LcC13:Ce scintillator for y-ray detection," Nucl. Instr. and Meth. Phys. Res. A 505: 76-81 (2003).

Shao et al., "Dual APD array readout of LSO crystals: optimization of crystal surface treatment," IEEE Trans. Nucl. Sci. 49(3):649-654 (2002).

Smith et al., "Design of multipinhole collimators for small animal SPECT," IEEE NSS/MIC Conference Records (2004).

Stahle et al., "Fabrication of CdZnTe strip detectors for large area arrays," SPIE 3115:90-97 (1997).

Streun et al., "Pulse shape discrimination of LSP and LuYAP scintilators for depth of intereaction detection in PET," IEEE Trans. Nucl. Sci. 50(3):344-347 (2003).

Tornai et al., Comparison of compact gamma cameras with 1.3- and 2.0-mm quantized IEEE Trans. Nucl. Sci. 52(5):1251-1256 (2005).

Yamamoto & Ishibashi, "A GSO depth of interaction detector for PET," IEEE Trans NucNucl.Sci. 45(3): 1078-1082 (1998).

Yamashita et al., "High resolution block detectors for PET," IEEE Trans. Nucl. Sci. 37(2):589-593 (1990).

* cited by examiner

HOT WALL SCINTILLATOR FABRICATION OF STRONTIUM HALIDE, CALCIUM HALIDE, CERIUM HALIDE, AND CESIUM BARIUM HALIDE SCINTILLATORS

CROSS-REFERENCES TO RELATED APPLICATIONS

The present application claims priority to U.S. Provisional Application 61/480,325, filed Apr. 28, 2011, which is incorporated by reference in its entirety.

BACKGROUND OF THE INVENTION

The present invention relates to hot wall scintillator fabrication methods and scintillators. More specifically, the present invention provides a variety of scintillators, including strontium halide scintillators, calcium halide scintillators, cerium halide scintillators and cesium barium halide scintillators. Related devices and methods of using the scintillators described herein are also provided.

Scintillation spectrometers are widely used in detection and spectroscopy of energetic photons (e.g., X-rays and g-rays). Such detectors are commonly used, for example, in nuclear and particle physics research, medical imaging, diffraction, non-destructive testing, nuclear treaty verification and safeguards, nuclear non-proliferation monitoring, and geological exploration.

Important requirements for the scintillation materials used in these applications include high light output, transparency to the light it produces, high stopping efficiency, fast response, good proportionality, low cost and availability in large volume. These requirements are often not met by many of the commercially available scintillators. While general classes of chemical compositions may be identified as potentially having some attractive scintillation characteristic(s), specific compositions/formulations and structures having both scintillation characteristics and physical properties necessary for actual use in scintillation spectrometers and various practical applications, as well as capability of imaging at a high resolution, have proven difficult to predict or produce. Specific scintillation properties are not necessarily predictable from chemical composition alone, and preparing effective scintillators from even candidate materials often proves difficult. For example, while the composition of sodium chloride had been known for many years, the invention by Hofstadter of a high light-yield and conversion efficiency scintillator from sodium iodide doped with thallium launched the era of modern radiation spectrometry. More than half a century later, thallium doped sodium iodide, in fact, still remains one of the most widely used scintillator materials. Since the invention of NaI(Tl) scintillators in the 1940's, for half a century radiation detection applications have depended to a significant extent on this material. As the methodology of scintillator development evolved, new materials have been added, and yet, specific applications, particularly those requiring high resolution imaging and large volumes, are still hampered by the lack of scintillators suitable for particular applications.

As a result, there is continued interest in the search for new scintillator formulations and physical structures with both the enhanced performance and the physical characteristics needed for use in various applications. Today, the development of new scintillators continues to be as much an art as a science, since the composition of a given material does not necessarily determine its performance and structural properties as a scintillator, which are strongly influenced by the history (e.g., fabrication process) of the material as it is formed. While it is may be possible to reject a potential scintillator for a specific application based solely on composition, it is not possible to predict whether a material with promising composition will produce a scintillator with the desired properties.

Thus, a need exists for scintillators that have imaging capability with improved properties, such as spatial and/or temporal resolution, and methods of making the scintillators.

BRIEF SUMMARY OF THE INVENTION

The present invention relates to hot wall scintillator fabrication methods and scintillators. The scintillators of the invention are useful in a variety of applications including, for example, spectroscopy detection of energetic photons (X-rays and gamma-rays) and imaging applications (e.g., X-ray imaging, PET (positron emission tomography), etc.).

In one aspect, the present invention provides a scintillator comprising, a dopant and a scintillator material selected from the group consisting of strontium halide, calcium halide, and cesium barium halide, wherein the scintillator is in the form of a microcolumnar scintillator film or a noncolumnar polycrystalline film. The scintillator films of the present invention can include $SrI_2$:Eu, $CaI_2$:Eu, $CeBr_3$, or $CsBa_2I_5$:Eu. In some embodiments, the scintillator films can include CaI or $CeBr_3$.

In another aspect, the present invention provides a radiation detection device including at least one of the scintillators provided herein (e.g., $SrI_2$:Eu, $CaI_2$:Eu, CaI, $CeBr_3$, or $CsBa_2I_5$:Eu); and a photodetector assembly optically coupled to the scintillator.

In yet another aspect, the present invention provides a method of performing radiation detection. The method can include providing a detector device including a scintillator provided herein (e.g., $SrI_2$:Eu, $CaI_2$:Eu, CaI, $CeBr_3$, or $CsBa_2I_5$:Eu); and a photodetector assembly optically coupled to the scintillator; and positioning a radiation source within a field of view of the scintillator so as to detect emissions from the radiation source.

In yet another aspect, the present invention provides methods of making a scintillator. The methods can include providing an evaporation apparatus comprising an evaporation chamber having a first end portion with a substrate positioned in a holder, and a second end portion with a first source boat separate from a second source boat, and one or more chamber walls at least partially disposed between the first and second end portions; positioning a dopant salt in the first source boat and a source salt in the second source boat; and depositing a scintillator film comprising a source and a dopant on a surface of the positioned substrate, wherein the source salt is selected from the group consisting of strontium halide, calcium halide, and cesium barium halide. In some embodiments, the hot wall evaporation techniques described herein can also be used to make $SrI_2$:Eu, $CaI_2$:Eu, or $CsBa_2I_5$:Eu scintillator films. In some embodiments, the hot wall evaporation techniques described herein can also be used to make $CeBr_3$ or CaI scintillator films.

For a fuller understanding of the nature and advantages of the present invention, reference should be had to the ensuing detailed description taken in conjunction with the accompanying drawings/figures. The drawings/figures represent embodiments of the present invention by way of illustration. The invention is capable of modification in various respects without departing from the invention. Accordingly, the draw-

DETAILED DESCRIPTION OF THE INVENTION

The present invention relates to hot wall scintillator fabrication methods and scintillators. More specifically, the present invention provides a variety of scintillators, including strontium halide scintillators, calcium halide scintillators, cerium halide scintillators and cesium barium halide scintillators. Related devices and methods of using the scintillators described herein are also provided.

The methods and structures described herein can be used to make a variety of scintillator compositions. For example, the present invention provides, but is not limited to, strontium halide scintillators, calcium halide scintillators, cerium halide scintillators, or cesium barium halide scintillators. Halides can include fluoride, chloride, bromide and/or iodide. The scintillators can include strontium iodide-based (e.g., $SrI_2$) scintillator compositions. In some embodiments, the scintillators include cerium bromide (e.g., $CeBr_3$) scintillator compositions. Cesium barium iodide-based (e.g., $CsBa_2I_5$) scintillator compositions are also provided. Calcium iodide scintillators (e.g., $CaI_2$, $CaI_2$:Eu, and $CaI_2$:Tl) are further provided herein. Other halide scintillators, include, but are not limited to, doped $SrBr_2$, $CaBr_3$, and $CeCl_3$.

The scintillator compositions of the present invention can optionally include a "dopant." In certain embodiments, the scintillators described herein will typically include a dopant. Dopants can affect certain properties, such as physical properties (e.g., brittleness, etc.) as well as certain scintillation properties (e.g., afterglow, etc.) of the scintillator composition. The dopant can include, for example, europium (Eu), praseodymium (Pr), cerium (Ce), thallium (Tl), terbium (Tb), and mixtures of any of the dopants. The amount of dopant present will depend on various factors, such as the application for which the scintillator composition is being used; the desired scintillation properties (e.g., emission properties, timing resolution, etc.); and the type of detection device into which the scintillator is being incorporated. For example, the dopant is typically employed at a level in the range of about 0.1% to about 20%, by molar weight. In some embodiments, the amount of dopant is in the range of about 0.1% to about 100%, or about 0.1% to about 5.0%, or about 5.0% to about 20%, by molar weight. In one embodiment, the scintillators can include $SrI_2$:Eu scintillator compositions. In another embodiment, the scintillators can include $CsBa_2I_5$:Eu scintillator compositions. As will be appreciated by one of ordinary skill in the art, cesium barium iodide is also termed barium cesium iodide (or europium-doped barium cesium iodide, or $Ba_2CsI_5$:Eu). In some embodiments, the scintillators can include $CaI_2$, $CaI_2$:Eu, or $CaI_2$:Tl scintillator compositions.

Figure 1:
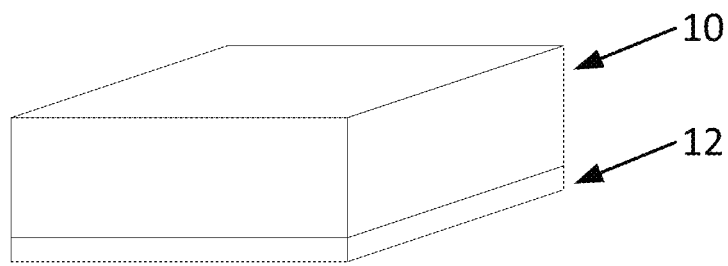
FIG. 1 illustrates an example scintillator film, according to one embodiment of the present invention.

The scintillators described herein (e.g., $SrI_2$:Eu, $CaI_2$:Eu, $CeBr_3$, or $CsBa_2I_5$:Eu scintillators) can be produced in a variety of different forms. As shown in FIG. 1, the scintillators can be a film 10 deposited on a substrate 12. For example, the scintillators described herein can be polycrystalline or crystalline. In certain embodiments, the scintillators described herein can be microcolumnar scintillators. Column widths of the microcolumnar scintillators can be, e.g., greater than about 5 microns in width. In some embodiments, the columns can have widths between 5 microns and 100 microns, between 100 microns and 1 millimeter, and higher. An upper limit for the microcolumns can be a width that is the same as the thickness of the film. In some embodiments, the scintillators described herein are in the form of a polycrystalline film. The scintillators can be a microcolumnar scintillator film. In some embodiments, scintillators can be produced as transparent or translucent scintillators that include a crystalline or polycrystalline layer(s).

The scintillators described herein can be produced in a variety of thicknesses and spatial areas. Thicknesses of the films can be designed for certain imaging applications. For example, thin films (e.g., less than 20 μm) can be used to detect alpha particles, while limiting interference from detection of gamma rays. Thickness of the films can also be tailored to detect, for example, gamma rays, while also allowing for sufficient light transmission. Spatial resolution for, e.g., microcolumnar scintillators, can also be tailored by thickness of the films. In some embodiments, scintillators can be produced as a thin film, e.g., films having a thickness ranging from about 10 μm to about 1 cm. In certain embodiments, the scintillators can be thick films having a thickness of 1 cm or greater, and can be referred to as "slabs." In some embodiments, scintillators can have thickness of less than about 20 microns, less than about 500 microns, or less than about 1 cm. In certain embodiments, the scintillators can have a thickness greater than about 1 cm, greater than about 3 cm, or greater than about 5 cm. The scintillators described herein can be freestanding films, e.g., where the deposited film can be removed from the substrate after deposition. The scintillators can be deposited over small to wide areas on the order, for example, of $mm^2$ or $cm^2$ (e.g., up to 50×50 $cm^2$).

Scintillator compositions and assemblies of the present invention can further include one or more reflective coatings, e.g., formed on a substrate surface or otherwise coupled with a scintillator. In one embodiment, a reflective coating can be formed on a substrate surface prior to deposition of the scintillator, such as in the case of opaque substrates. One embodiment includes the use of substrates such as alumina that are themselves white in color and act as an excellent reflector. Another embodiment includes the use of substrates that are themselves photodetectors (e.g., SSPMs, amorphous silicon arrays, CCDs, and CMOS devices). For graphite-like substrates, reflective metal coatings can be formed. In addition to being highly reflective, such coatings may be required to withstand high process temperatures, maintain adhesion to the substrate during and after deposition, and/or be chemically inert with the scintillator or suitable for coating with a chemically inert material, such as an organic polymer or resin (e.g., Parylene C). For transparent substrates a reflective coating can be applied atop the scintillator film directly or after deposition of one or more other coatings, such as a Parylene coating. As noted above, various coating technologies can be utilized for forming coatings with the required optical and/or protective properties.

The present invention includes methods and structures for fabricating the scintillators described herein. In some embodiments, the scintillators described herein can be grown using a vapor deposition technique, co-evaporation in a hot wall evaporation (HWE) apparatus. In certain embodiments, the hot wall evaporation techniques can include hot wall epitaxial growth of the scintillators described herein. Hot wall evaporation techniques, as described herein, include a vacuum deposition technique where scintillator film is efficiently deposited on a surface of a substrate. In the simplest form the HWE apparatus includes a chamber or cylinder positioned in a vacuum, heated, with an evaporation source "boat" or reservoir at one end (typically the bottom in an upright positioned chamber) and a temperature controlled substrate at the other (typically the top in an upright positioned chamber). In certain embodiments, the disclosed methods make use of salts and vapor deposits them, e.g., simultaneously, on a suitable substrate using two independent sources. Under different deposition conditions, the material grows in the desired form. In one embodiment, two source boats are used to accomplish co-evaporation of a salt and a dopant salt for deposition of a scintillator film on a substrate surface. In some embodiments, the HWE techniques can include three or more source boats. Each boat can contain a particular source material (a.k.a. charge) of interest to produce the scintillators described herein. The source boats can be positioned separate (e.g., laterally spaced) from each other.

Figure 2:
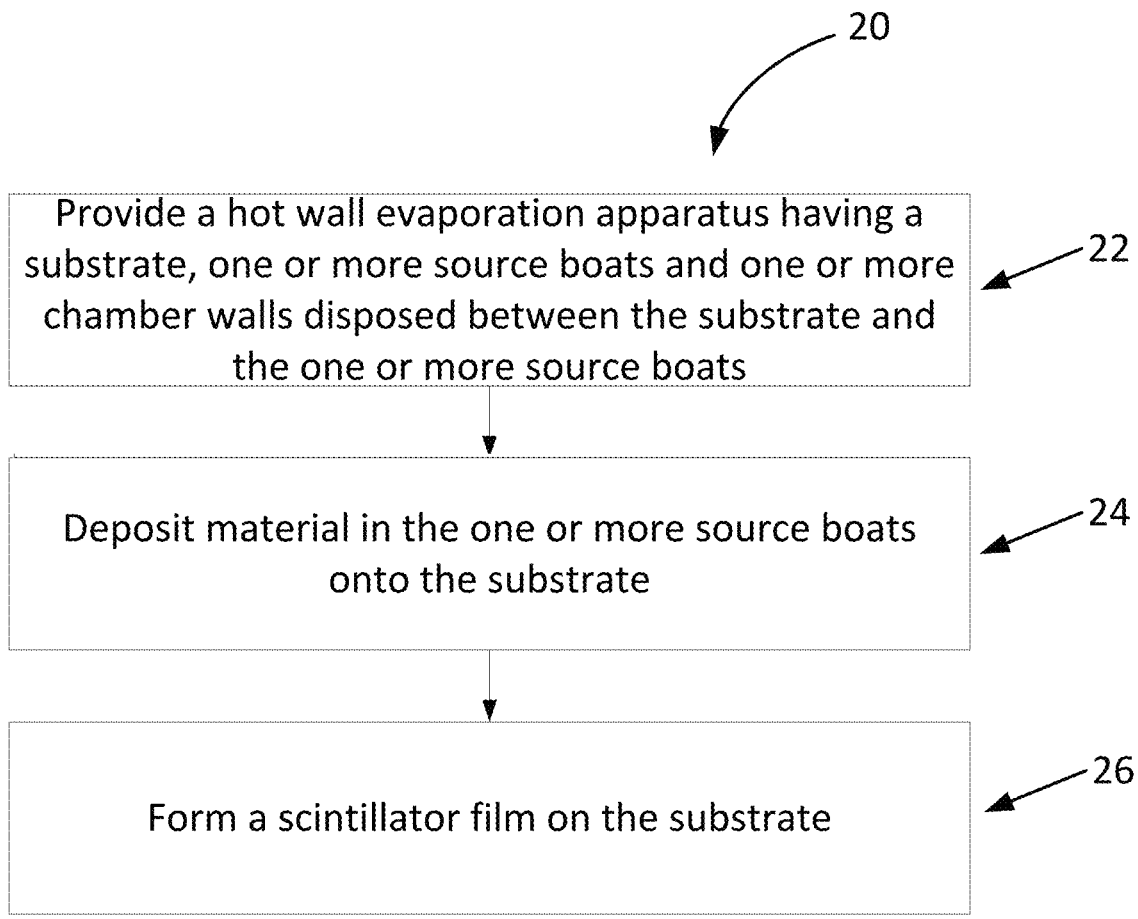
FIG. 2 shows a hot wall evaporation method, according to an embodiment of the present invention.

FIG. 2 provides an example method 20 for performing hot wall evaporation to make a doped zinc telluride scintillator. In general, the method can include providing a hot wall evaporation apparatus having a substrate, one or more source boats and one or more chamber walls disposed between the substrate and the one or more source boats 22. Material in the one or more source boats can be deposited onto the substrate 24, and a scintillator material (e.g., a strontium halide, calcium halide, cerium halide, or cesium barium halide scintillator film) can be formed on the substrate 26.

Figure 3:
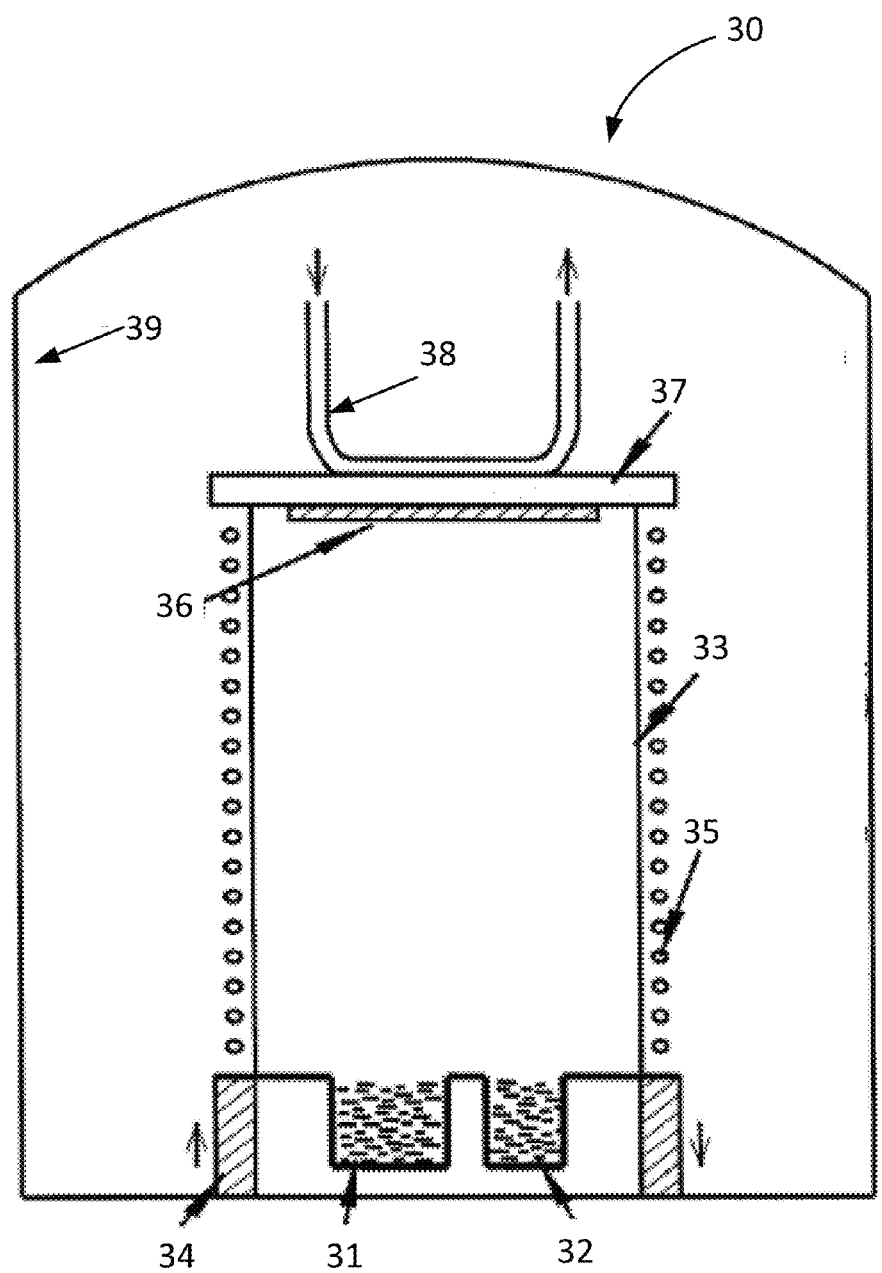
FIG. 3 shows a hot wall evaporation apparatus, according to an embodiment of the present invention.

FIG. 3 shows an example hot wall evaporation apparatus 30 for use in the present invention. A first precursor boat 31 and a first precursor boat 32 are co-located at one end of a hot wall column 33 (e.g., a metallic cylinder). Heater electrodes 34 are located next to the precursor boats, and resistive heaters 35 are provided around the hot wall column to heat to a temperature, $T_{wall}$. A substrate 36 is positioned at the other end of the hot wall column opposing the precursor boats 31, 32. The substrate 36 is contacted to a cooled substrate holder 37 that can be cooled, e.g., by a liquid cooling system 38. The components of the apparatus 30 are provided in a vacuum chamber 39. In one embodiment, temperature ranges for making $SrI_2$:Eu can be $T_{wall}$ from about 750° C. to about 800° C., $T_{source}$ from about 500° C. to about 700° C., and $T_{substrate}$ can be from about 300° C. to about 450° C.

Figure 4:
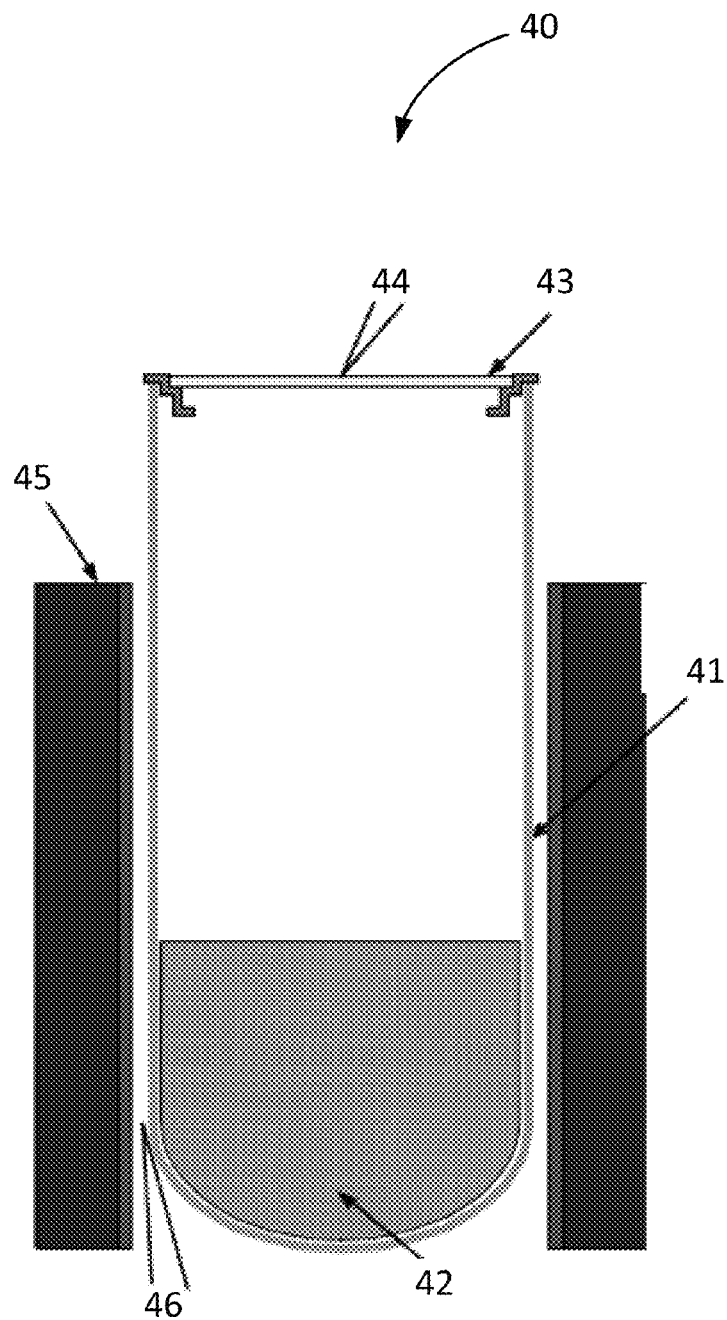
FIG. 4 shows a hot wall evaporation apparatus, according to an embodiment of the present invention.

FIG. 4 shows another example hot wall evaporation apparatus 40 for use in the present invention. In one form the HWE apparatus includes a chamber or cylinder (e.g., a quartz crucible) 41 positioned in a vacuum, heated, with an evaporation source "boat" or reservoir holding a source material 42 at one end (typically the bottom in an upright positioned chamber) and a temperature controlled substrate 43 at the other (typically the top in an upright positioned chamber). In an example of making $SrI_2$:Eu, the temperature of the substrate 43 can be controlled with a thermocouple 44, such that, e.g., the substrate has a temperature between about 300° C. and about 450° C. The chamber or cylinder can be heated by chamber walls including a heater 45 that can include a thermocouple 46 configured to heat the chamber or cylinder at temperatures, e.g., between about 750° C. to about 800° C. In general, source material temperatures are at least the melting points of the materials used; e.g., 5% to 10% above the source material's ° C. melting point.

For HWE, the heated cylinder wall serves to enclose, deflect and effectively direct the vapor from the source to the substrate where molecules are deposited with a shallow impinging angle. With the substrate being the coolest part in the system (e.g., compared to the cylinder wall and source material), molecules adhere solely or primarily to the substrate and do not substantially accumulate on the hot walls, making efficient use of the source material. To ensure thermodynamic equilibrium the relationship between the substrate temperature and that of the source and the heated wall should be: $T_{wall} > T_{source} > T_{substrate}$. After deposition, the deposited scintillator material can be annealed in a variety of atmospheric conditions Annealing can be used to enhance the performance of the scintillators described herein.

An advantage of HWE is that it preserves the composition of the grown film with reference to the evaporants even though they have relatively large differences in vapor pressures and sticking coefficients. This is due to the fact that HWE takes place under conditions of thermodynamic equilibrium, which allows the high vapor pressures of various compounds to be maintained. As a result, the dissociation of various constituents does not present a problem for film growth. As a matter of fact, the interaction of components with each other on the substrate surface can lead, under favorable growth conditions, to the formation and growth of the well-structured films.

Deposition of microcolumnar films involves methods where the evaporated material be incident on the substrate at a grazing angle. HWE creates this condition through minimized mean free path for the vaporized molecules due to the large density of evaporated material, and through efficient reflection of molecules from walls, which are maintained at the highest temperature in the setup. Thus, the thermodynamic equilibrium and atmosphere conducive to growth created by the HWE process allows deposition of stoichiometrically balanced films with well-separated columnar morphology.

Another aspect of HWE is its high (close to 100%) deposition efficiency, as the substrate is the coldest part of the evaporation environment. As a result, vapors that impinge on HWE system parts, including the hot walls, are deflected and mostly condense only on the relatively cool substrate. Consequently, material loss is at a minimum, enhancing the deposition efficiency to 95% or more (and greatly simplifying apparatus cleaning and maintenance).

A feature of HWE for thick film deposition is that the growth rate is an order of magnitude higher than that of conventional physical vapor deposition (PVD) systems. For a single evaporant material system the deposition rate is proportional to the impingement rate (ø) of atoms on the substrate at constant temperature, and is governed by the equation (1):

$$\varnothing = n(kT/2\Pi m)^{1/2} \qquad (1)$$

where n is the number of evaporant molecules per unit volume, k is the Boltzmann constant, T is the source temperature, and m is the mass of the molecule. For hot wall evaporation of ZnTe:O, a two-evaporant system, this equation still holds, since the vapor phases of the constituent compounds are in equilibrium with the source materials. Therefore, the two evaporant deposition process is basically very similar to that for a single evaporant material. As the source temperature T is very high and the substrate is the coldest part in the evaporator, the impingement rate of molecules and, hence, the film growth rate is an order of magnitude higher than with conventional systems. The growth rate is related to the impingement rate by the following equation (2):

$$\text{Growth rate} = \{\emptyset \ast \text{Average thickness of ZnTe:O monolayer}\} / \{\text{Surface density of ZnTe:O}\} \quad (2)$$

The process of material growth can consist of a series of events that begin with the physical adsorption of a fraction of the incident molecules on the substrate or by forming a stable nucleus by interaction with the other adsorbed molecules. This process of nucleation and growth is typical for the formation of a film of one material on a substrate of a different material. In HWE, no nucleation takes place, but growth occurs by direct adsorption of the molecules on low energy sites, such as kinks on an atomic ledge on the substrate. Under these conditions, even when the growth rate is very high, a monolayer-by-monolayer deposition is obtained resulting in excellent stoichiometry of the films.

In some embodiments, there can be additional modifications to the methods and apparatus for making strontium halide scintillators (e.g., $SrI_2$:Eu). For example, $SrI_2$:Eu is a highly corrosive material, so a cold trap is used to protect vacuum pumps. Also, chamber cleaning after deposition is important. Substrate cooling is necessary, since wall temperatures are high. A planetary system can be used which rotates at least one substrate around a system axis as well as around an axis that is normal to the surface of the substrate. A rate of about 1 to 2 rotations per second would be used. Deposition parameters (e.g., temperatures) are adjusted accordingly to achieve a high growth rate of about 10 to about 25 microns per minute, with good thickness uniformity (say, 5% to 10%). For example, gamma detectors use thick sensors for the sake of detection efficiency, so high growth rates are desirable.

In certain embodiments, temperature control for making strontium halide can occurs in three stages: (1) Ramp-up: From ambient room temperature to a range of about 500° C. to about 700° C., about 3 hours, at a slow rate in order to allow and achieve the necessary dehydration of source materials before beginning deposition. Otherwise, moisture in the source materials can vaporize rapidly, causing undesirable sputtering of source materials; (2) Deposition: Temperatures are held at the desired level; e.g., within the range of about 500° C. to about 700° C. Deposition proceeds for a period of time that depends upon the desired scintillator thickness; (3) Ramp-down: The temperature is slowly decreased to ambient room temperature, from about 5 to 10 hours, in order reduce stress on the deposited film. Vacuum is achieved and held between about $10^{-4}$ to about $10^{-7}$ Torr. Source materials are heated to temperatures that are at least (e.g., by 5% to 10%) their melting points; e.g., for $SrI_2$:Eu, the $SrI_2$ source would be heated to about 500° C., and the $EuI_2$ source would be heated to about 875° C. The evaporation rates for $SrI_2$ and $EuI_2$ to produce $SrI_2$:Eu with 2% to 5% Eu doping, for example, can be about 25 microns/minute for $SrI_2$ and about 0.5 to about 1.25 microns per minute for $EuI_2$.

Similar processes can be used to make calcium halide scintillators. Material vaporization temperatures for the calcium halide source and dopant materials can be slightly above (e.g., by 5% to 10%) respective melting points. For $CaI_2$:Eu and $CaI_2$:Tl, the melting point for $CaI_2$ is about 783° C., $EuI_2$ about 875° C., and TlI about 300° C. For $Ba_2CsI_5$:Eu, the process is the same, except a vaporization temperature between about 500° C. and about 600° C. can be used for the source material, polycrystalline $Ba_2CsI_5$:Eu, which can be prefabricated by melt growth from an admixture of $BaI_2$, CsI and $EuI_2$.

As set forth above, scintillator compositions of the present invention may find use in a wide variety of applications. In one embodiment, for example, the invention is directed to a method for detecting energetic (e.g., ionizing) radiation (e.g., gamma-rays, X-rays, neutron emissions, alpha particles, beta particles and the like) with high energy resolution using a detector based on a scintillator described herein. In certain embodiments, the microcolumnar form of scintillators described herein can be used for high spatial resolution imaging.

Figure 5:
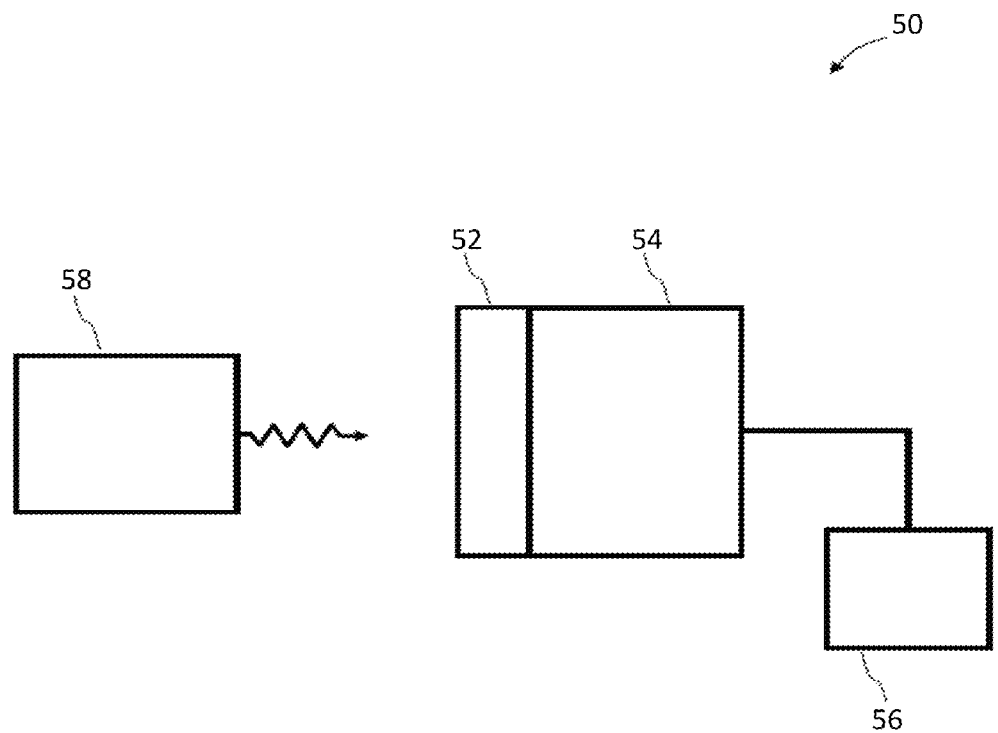
FIG. 5 shows a hot wall evaporation method, according to an embodiment of the present invention.

FIG. 5 is a diagram of a detector assembly or radiation detector of the present invention. The detector 50 includes a scintillator 52 operably coupled to a light photodetector 54 or imaging device. The detector assembly 50 can include a data analysis, or computer, system 56 to process information from the scintillator 52 and light photodetector 54. In use, the detector 50 detects energetic radiation emitted form a source 58.

A data analysis, or computer, system thereof can include, for example, a module or system to process information (e.g., radiation detection information) from the detector/photodetectors in an invention assembly and can include, for example, a wide variety of proprietary or commercially available computers, electronics, or systems having one or more processing structures, a personal computer, mainframe, or the like, with such systems often comprising data processing hardware and/or software configured to implement any one (or combination of) the method steps described herein. Any software will typically comprise machine readable code of programming instructions embodied in tangible media such as a memory, a digital or optical recording medium, optical, electrical, or wireless telemetry signals, or the like, and one or more of these structures may also be used to transmit data and information between components of the system in any of a wide variety of distributed or centralized signal processing architectures.

The detector assembly typically includes material formed from the scintillator compositions described herein (e.g., $SrI_2$:Eu, $CaI_2$:Eu, $CeBr_3$, or $CsBa_2I_5$:Eu scintillators). The detector further can include, for example, a light detection assembly including one or more photodetectors. Non-limiting examples of photodetectors include photomultiplier tubes (PMT), photodiodes, PIN detectors, charge coupled device (CCD) sensors, image intensifiers, avalanche detectors and the like. Choice of a particular photodetector will depend in part on the type of radiation detector being fabricated and on its intended use of the device. In certain embodiments, the photodetector may be position-sensitive. Detectors can further include imaging devices that can acquire images at high frame rates, such as frame rates that are faster than about 30 frames per second, about 100 frames per second, or about 1000 frames per second.

The detector assemblies themselves, which can include the scintillator and the photodetector assembly, can be connected to a variety of tools and devices, as mentioned previously. Non-limiting examples include nuclear weapons monitoring and detection devices, well-logging tools, and imaging devices, such as nuclear medicine devices (e.g., PET). Various technologies for operably coupling or integrating a radiation detector assembly containing a scintillator to a detection device can be utilized in the present invention, including various known techniques. In certain embodiments, the radiation detector comprises a scintillator described herein formed on a substrate that is optically coupled to the photodetector.

Similarly, scintillator screens including a scintillator described herein can be included in a radiation detector such that the screen is optically coupled to the photodetector.

The detectors may also be connected to a visualization interface, imaging equipment, or digital imaging equipment (e.g., pixilated flat panel devices). In some embodiments, the scintillator may serve as a component of a screen scintillator. Energetic radiation, e.g., X-rays, gamma-rays, neutron, originating from a source, would interact with the scintillator and be converted into light photons, which are visualized in the developed film. The film can be replaced by amorphous silicon position-sensitive photodetectors or other position-sensitive detectors, such as avalanche diodes and the like. In some embodiments, neutrons can be indirectly detected by coupling (e.g., incorporating into or contacting) an absorbing converter material, such as but not limited to lithium, boron or gadolinium, into/with a scintillator described herein, and then detecting emissions (e.g., X-rays and/or alpha particles) produced by interactions between the neutrons and the absorbing converter material.

The methods of the present invention further include methods of performing radiation detection. The methods of performing radiation detection can include providing a detection device comprising a scintillator composition including a scintillator described herein; and a photodetector assembly operably (e.g., optically) coupled to the scintillator composition; and positioning the device such that a radiation source is within a field of view of the scintillator composition so as to detect emissions from the source. Emissions from the source can include x-rays, gamma-rays, neutrons, alpha particles, beta particles, or a combination thereof. In certain embodiments, a material (e.g., a patient, plant, animal, object, liquid, or gas) can be positioned between the radiation source and the scintillator composition. In some embodiments, the radiation source includes a material (e.g., a patient, plant, animal, object, liquid, or gas). In another embodiment, a material of interest (e.g., a patient, plant, animal, object, liquid, or gas) may scatter energetic radiation to the scintillator. The methods of radiation detection may also include X-ray and gamma ray astronomy and cosmic ray detection (e.g., in salt mines). In certain embodiments, a material to be analyzed can be positioned between the radiation source and the scintillator. In some embodiments, the radiation source includes a patient. In some embodiments, the detector can be positioned such that the radiation source is in the field of view of the scintillator. Alternatively, the radiation source can be positioned in the field of view of the scintillator contained in the detector. Also, both the radiation source and the detector can be moved at the same time such that the radiation source is in the field of view of the scintillator.

Imaging devices, including medical imaging equipment, such as PET and SPECT (single-photon emission computed tomography) devices, and the like, represent other potential applications for the invention scintillator compositions and radiation detectors. Furthermore, geological exploration devices, such as well-logging devices, were mentioned previously and represent an important application for these radiation detectors. The assembly containing the scintillator usually includes, for example, an optical window at one end of the enclosure/casing. The window permits radiation-induced scintillation light to pass out of the scintillator assembly for measurement by the photon detection assembly or light-sensing device (e.g., photomultiplier tube, etc.), which is coupled to the scintillator assembly. The light-sensing device converts the light photons emitted from the scintillator into electrical pulses that may be shaped and digitized, for example, by the associated electronics. By this general process, gamma rays can be detected, which in turn provides an analysis of geological formations, such as rock strata surrounding the drilling bore holes.

In applications of a scintillator composition, including those set forth above (e.g., nuclear weapons monitoring and detection, imaging, and well-logging and PET technologies), certain characteristics of the scintillator are desirable, including its light output (higher is can be preferred), rise time (faster can be preferred) and decay time (shorter can be preferred), timing shape (e.g., fixed or varying, depending upon dopant concentration used to analyze scintillation events), energy resolution (finer/lower % can be preferred), spatial resolution (finer, e.g., higher, can be preferred), and suitable physical properties. The present invention is expected to provide scintillator materials which can provide the desired high light output and initial photon intensity characteristics for demanding applications of the technologies. Furthermore, the scintillator materials are also expected to be produced efficiently and economically, and also expected to be employed in a variety of other devices which require radiation/signal detection (e.g., gamma-ray, X-ray, neutron emissions, and the like).

The following examples are provided to illustrate but not limit the invention.

EXAMPLES

Example 1

Fabrication of $SrI_2$:Eu (Europium-Doped Strontium Iodide) Scintillator Films

This example describes fabrication of polycrystalline microcolumnar scintillator films of europium-doped strontium iodide ($SrI_2$:Eu). A wide range of uniform thickness $SrI_2$:Eu films can be made ranging from less than 1 mm to greater than 1 cm. Films having diameters of 7 cm or more can also be fabricated. The hot wall evaporation methods described herein can be used to make the $SrI_2$:Eu films, and since $SrI_2$:Eu is highly deliquescent the apparatuses and methods can provide encapsulation techniques for protecting the materials. Scintillation properties can be optimized for a variety of applications.

Figure 6:
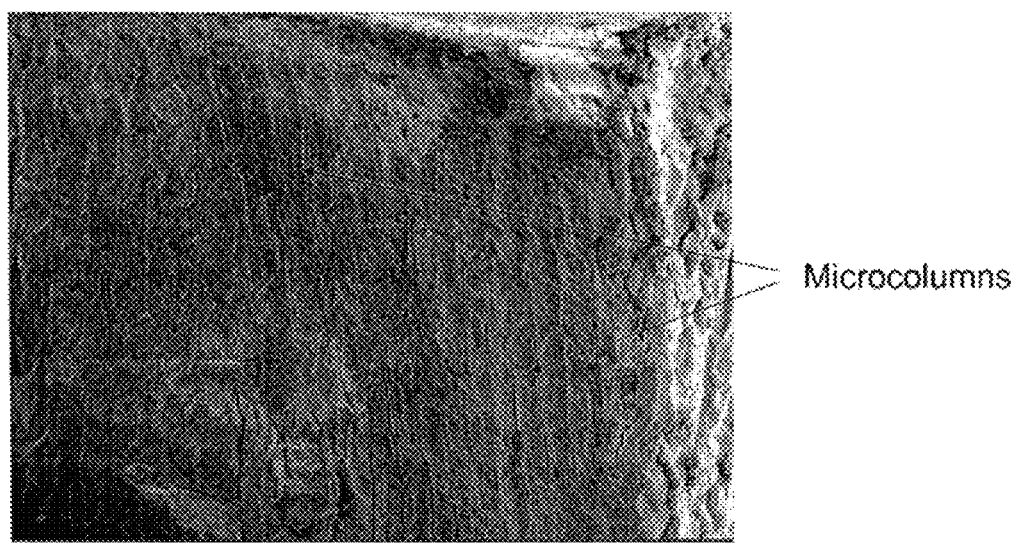
FIG. 6 shows a microcolumnar structure of a $SrI_2$:Eu scintillator film, according to an embodiment of the present invention.

A variety of hot wall evaporation deposition conditions can be used. FIG. 3 shows an example hot wall evaporation apparatus used to deposit the $SrI_2$:Eu films. In this example, 20 grams of $SrI_2$ was placed in one precursor boat and 2.5 grams of $EuI_2$ was placed in a second precursor boat. The maximum evaporation temperature was about 800° C. The base pressure in the apparatus was $10^{-5}$ torr. Deposition time was three hours with 30 minutes of dwell time at 800° C. and 2.5 hours of ramp-up and ramp-down time total. The thickness of the film was 7 mm maximum with a slight parabolic profile. Another film was fabricated that was 38 mm in diameter and approximately 7 mm thick. The light emission of the film was 59,500 ph/MeV, as normalized to the quantum efficiency of the measuring system. $SrI_2$:Eu had an emission wavelength at 435 nm. The films were encapsulated, hermetically sealed in an aluminum enclosure with a quartz window on one side. Residual window sealant in the capsule reacted with the $SrI_2$:Eu causing white and yellow discoloration around the periphery. As shown in FIG. 6, scanning electron microscopy showed a microcolumnar structure of the deposited $SrI_2$:Eu film, which can improve imaging resolution by channeling light to the surface of the film and to a photodetector.

Gamma ray spectra were compared between a 1.2 mm thin film of $SrI_2$:Eu and a single crystal of $LaBr_3$:Ce. The shaping time for LaBr$_3$:Ce was 0.25 microseconds, and the shaping time for SrI$_2$:Eu was 4 microseconds. The gamma source was Co-57 (122 keV). The gamma light yield for the LaBr$_3$:Ce single crystal was 52,000 ph/MeV and 59,500 ph/MeV for the 1.2 mm thin film of SrI$_2$:Eu.

Example 2

Fabrication of CeBr$_3$ Scintillator Films

Figure 7:
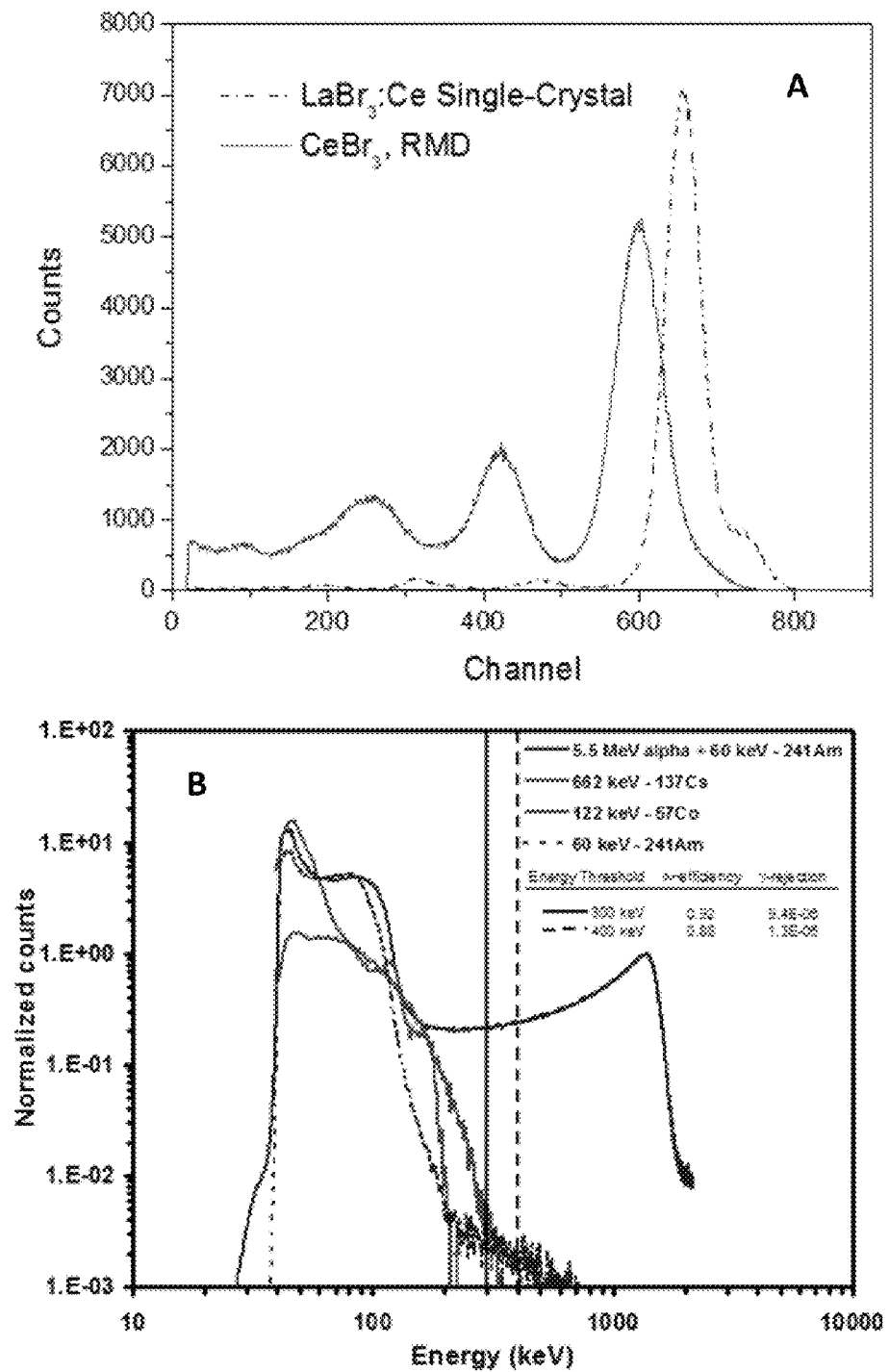
FIGS. 7A and 7B provide spectra of a cerium bromide scintillator film, according to an embodiment of the present invention.

This example describes growth of CeBr$_3$ films using hot wall evaporation, the method that can produce relatively inexpensive large area, thick films in desired shapes or sizes. The CeBr$_3$ material could be grown in polycrystalline form suitable for spectroscopic applications, or even in the microcolumnar form desirable for high spatial resolution gamma ray imaging. Films produced using this approach possess all of the excellent properties of their melt-grown crystal counterparts. FIG. 7A shows light yield and energy resolution of as-fabricated 1 mm CeBr$_3$ film approaching that of a LaBr$_3$:Ce commercial single crystal. FIG. 7B is a response of a 20 micron thick CeBr$_3$ film to 5.5 MeV alpha particles from [241]Am source demonstrating high detection efficiency and excellent gamma ray rejection. Also plotted are the response of the same film to 60 keV [241]Am, 662 keV $^{137}$Cs, and 122 keV [57]Co gamma rays, showing excellent gamma ray discrimination.

What is claimed is:

1. A scintillator comprising, a dopant and a scintillator material selected from the group consisting of strontium halide, calcium halide, and CsBa$_2$I$_5$, wherein the scintillator is in the form of a microcolumnar scintillator film or a noncolumnar polycrystalline film.

2. The scintillator of claim 1, wherein the dopant is Eu, Pr, Ce, Tl, Tb, or any combination thereof.

3. The scintillator of claim 1, having the formula: SrI$_2$:Eu.

4. The scintillator of claim 1, having the formula: CaI$_2$:Eu or CaI$_2$:Tl.

5. The scintillator of claim 1, having the formula: CsBa$_2$I$_5$:Eu.

6. The scintillator of claim 1, wherein the scintillator has a thickness of less than or equal to 1 cm.

7. The scintillator of claim 1, wherein the scintillator has a thickness greater than 1 cm.

8. A scintillator comprising, a scintillator material comprising cerium bromide (CeBr$_3$) or calcium iodide (CaI$_2$), wherein the scintillator is in the form of a microcolumnar scintillator film or a noncolumnar polycrystalline film.

9. A radiation detection device comprising a scintillator of claim 1 or 8; and a photodetector assembly optically coupled to the scintillator.

10. The radiation detection device of claim 9, further comprising electronics coupled to the photodetector assembly so as to output image data in response to radiation detected by the scintillator.

11. A method of performing radiation detection, comprising:

providing a detector device comprising a scintillator of claim 1 or 8; and a photodetector assembly optically coupled to the scintillator; and positioning a radiation source within a field of view of the scintillator so as to detect emissions from the radiation source.

12. A method of making a scintillator, the method comprising:

providing an evaporation apparatus comprising an evaporation chamber having a first end portion with a substrate positioned in a holder, and a second end portion with a first source boat separate from a second source boat, and one or more chamber walls at least partially disposed between the first and second end portions;

positioning a dopant salt in the first source boat and a source salt in the second source boat; and depositing a scintillator film comprising a source and a dopant on a surface of the positioned substrate, wherein the film is deposited by a process comprising applying heat to the evaporation chamber so as to vaporize the dopant salt and the source salt for film deposition while maintaining, for at least a portion of the deposition process, a temperature of the one or more chamber walls to be greater than: a) a temperature of the dopant salt in the first source boat and b) a temperature of the source salt in the second source boat.

13. The method of claim 12, wherein, during at least a portion of the process used to deposit the film, a temperature of the substrate is maintained to be less than: a) the temperature of the dopant salt in the first source boat and b) the temperature of the source salt in the second source boat.

14. The method of claim 12, wherein the scintillator film comprises SrI:Eu, CaI$_2$:Eu, CaI$_2$:Tl, or CsBa$_2$I$_5$:Eu.

15. The method of claim 12, wherein the dopant salt comprises Eu, Pr, Ce, Tl, Tb, or any combination thereof.

16. The method of claim 12, wherein the dopant salt comprises EuI.

17. A scintillator produced by the method of claim 12.

18. The method of claim 17, wherein the scintillator film comprises CeBr$_3$ or CaI.

19. The method of claim 12, wherein the source salt is selected from the group consisting of strontium halide, calcium halide, and CsBa$_2$I$_5$.

20. A method for making a scintillator film, the method comprising:

providing an evaporation apparatus comprising an evaporation chamber having a first end portion with a substrate positioned in a holder, and a second end portion with a source boat, and one or more chamber walls at least partially disposed between the first and second end portions;

positioning a calcium halide source material in the source boat; and depositing a scintillator film on a surface of the positioned substrate to form the scintillator film, wherein the scintillator film comprises calcium halide.

* * * * *